(12) United States Patent
Kim et al.

(10) Patent No.: US 7,986,211 B2
(45) Date of Patent: Jul. 26, 2011

(54) INDUCTOR

(75) Inventors: Seong-il Kim, Daejeon (KR); Jongmin Lee, Daejeon (KR); Byoung-Gue Min, Daejeon (KR); Hyung Sup Yoon, Daejeon (KR); Hae Cheon Kim, Daejeon (KR); Eun Soo Nam, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/968,022

(22) Filed: Dec. 14, 2010

(65) Prior Publication Data

US 2011/0140825 A1    Jun. 16, 2011

(30) Foreign Application Priority Data

Dec. 15, 2009    (KR) .................. 10-2009-0124720

(51) Int. Cl.
*H01F 5/00*    (2006.01)
(52) U.S. Cl. ...................................... 336/200
(58) Field of Classification Search .......... 336/65, 336/200, 232; 257/531
See application file for complete search history.

(56) References Cited

U.S. PATENT DOCUMENTS

| 6,611,188 | B2 | | 8/2003 | Yeo et al. | |
| 6,975,199 | B2 | * | 12/2005 | Long et al. | 336/200 |
| 7,170,384 | B2 | * | 1/2007 | Kim et al. | 336/200 |
| 7,339,452 | B2 | * | 3/2008 | Lee | 336/200 |
| 7,405,642 | B1 | * | 7/2008 | Hsu et al. | 336/200 |
| 7,417,525 | B2 | * | 8/2008 | Lee et al. | 336/200 |
| 7,868,727 | B2 | * | 1/2011 | Chen et al. | 336/200 |

FOREIGN PATENT DOCUMENTS

| KR | 10-0613180 A | 8/2006 |
| KR | 10-0668220 A | 1/2007 |
| KR | 10-0723032 A | 5/2007 |

* cited by examiner

*Primary Examiner* — Tuyen Nguyen
(74) *Attorney, Agent, or Firm* — Rabin & Berdo, PC

(57) ABSTRACT

Provided is an inductor. The inductor includes a first to a fourth conductive terminals formed in one direction within a semiconductor substrate, a first conductive line formed on one side of the semiconductor substrate and electrically connected to the second and third conductive terminals interiorly positioned among the first to fourth conductive terminals, a second conductive line formed on the one side of the semiconductor substrate and electrically connected to the first and fourth conductive terminals exteriorly positioned among the first to fourth conductive terminals, and a third conductive line formed on the other side of the semiconductor substrate and electrically connected to the first and third conductive terminals among the first to fourth conductive terminals.

20 Claims, 8 Drawing Sheets

INDUCTOR

CROSS-REFERENCE TO RELATED APPLICATIONS

This U.S. non-provisional patent application claims priority under 35 U.S.C. §119 of Korean Patent Application No. 10-2009-0124720, filed on Dec. 15, 2009, the entire contents of which are hereby incorporated by reference.

BACKGROUND OF THE INVENTION

The present invention disclosed herein relates to an inductor, and more particularly, to an inductor implementable on a semiconductor substrate.

An inductor is one of the most important components for an electric circuit with a resistor, a capacitor, a transistor and a power source. The inductor has a coil structure where copper or aluminum is wound many times as a screw form. The inductor suppresses a rapid change of a current by inducing the current in proportion to an amount of a current change. Herein, a ratio of counter electromotive force generated due to electromagnetic induction according to the change of the current flowing in a circuit is called an inductance (L).

Generally, the inductor is used for an Integrated Circuit (IC) and a Monolithic Microwave Integrated Circuit (MMIC) for communication. Particularly, a packaging technology for integrating many elements to a single chip is being developed with a recent advent of a technology related to a System on Chip (SoC). Accordingly, the inductor having a micro-structure and good characteristics is needed. Particularly, in the case of implementing the inductor on a single wafer, the inductor floated on a substrate is easily damaged by an external impact, has a low durability, and is difficult to be fabricated.

SUMMARY OF THE INVENTION

The present invention provides an inductor implemented on a small area with excellent characteristics.

Embodiments of the present invention provide inductors including a first to a fourth conductive terminals formed in one direction within a semiconductor substrate, a first conductive line formed on one side of the semiconductor substrate and electrically connected to the second and third conductive terminals interiorly positioned among the first to fourth conductive terminals, a second conductive line formed on the one side of the semiconductor substrate and electrically connected to the first and fourth conductive terminals exteriorly positioned among the first to fourth conductive terminals, and a third conductive line formed on the other side of the semiconductor substrate and electrically connected to the first and third conductive terminals among the first to fourth conductive terminals.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings so that this disclosure will be thorough and complete, and will fully convey the scope of the present invention to those skilled in the art.

Figure 1:
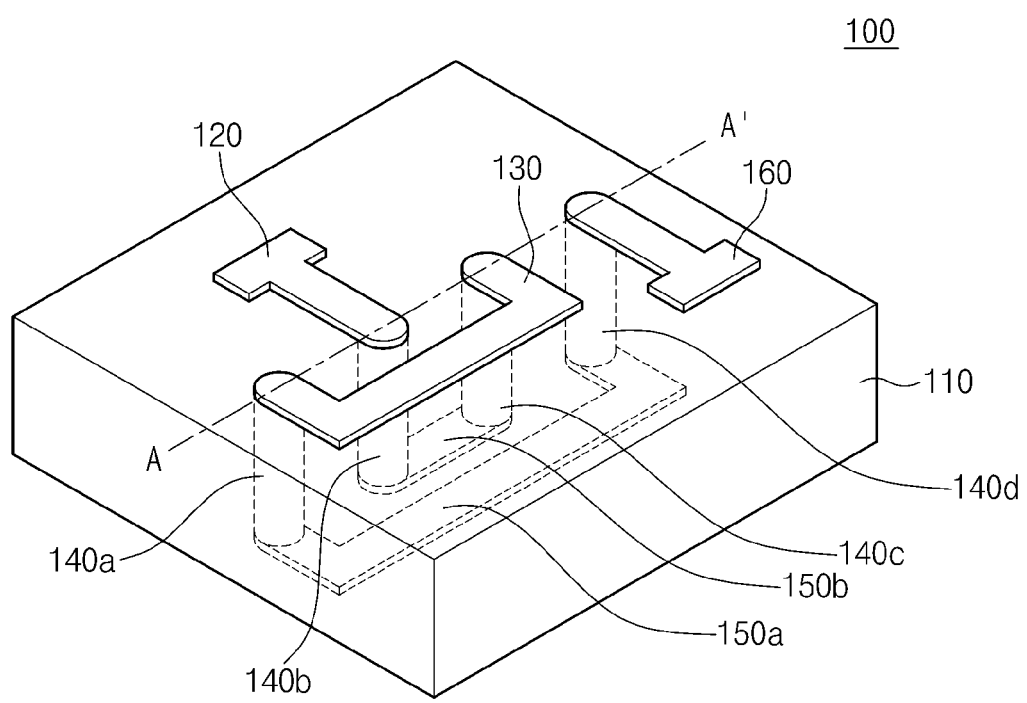
FIG. 1 is a perspective view illustrating an inductor according to an embodiment of the present invention.

FIG. 1 is a perspective view illustrating an inductor according to an embodiment of the present invention.

Referring to FIG. 1, an inductor 100 includes an input electrode unit 120, an upper horizontal conductive unit 130, first to fourth vertical conductive units 140A to 140D, first and second lower horizontal conductive units 150A and 150B, and an output electrode unit 160.

The first vertical conductive unit 140A is connected to the upper horizontal conductive unit 130 and the first lower horizontal conductive unit 150A through a via hole of a substrate 110. The second vertical conductive unit 140B is connected to the input electrode unit 120 and the second lower horizontal conductive unit 150B through the via hole of the substrate 110. The third vertical conductive unit 140C is connected to the upper horizontal conductive unit 130 and the second lower horizontal conductive unit 150B through the via hole of the substrate 110. The fourth vertical conductive unit 140D is connected to the output electrode 160 and the second lower horizontal conductive unit 150B through the via hole of the substrate 110. The first to fourth vertical conductive units 140A to 140D provide one coil structure by connecting the upper horizontal conductive unit 130 to the first or second lower horizontal conductive unit 150A or 150B.

The substrate 110 directly contacts the first to fourth vertical conductive units 140A to 140D, the upper horizontal conductive unit 130, and the first and second lower horizontal conductive units 150A and 150B. Accordingly, it is preferable that the substrate 110 has insulative characteristics. In the embodiment of the present invention, the substrate 110 may be formed with high resistant silicon. For another instance, the substrate 110 may have the insulative characteristics by performing an insulation process on its surface. The substrate 110 includes a plurality of via holes, and each via hole vertically penetrates a body of the substrate 110.

The input electrode unit 120 and the output electrode unit 160 connect the inductor to a circuit on the same or an external substrate. In the embodiment of the present invention, the input electrode unit 120 and the output electrode unit 160 are exposed to an upper surface of the substrate 100. However, as another example, the input electrode unit 120 and the output electrode unit 160 may be connected to a lower circuit through the via hole passing through the substrate 110. The input electrode unit 120 and the output electrode unit 160 may be also exposed to the upper surface and a lower surface respectively.

The upper horizontal conductive unit 130 is formed on the upper surface of the substrate 110. The first and second lower horizontal conductive units 150A and 150B are formed on the lower surface of the substrate 110. The upper horizontal conductive unit 130, the first and second lower horizontal conductive units 150A and 150B may be formed in a method of plating or deposition. For instance, in the case of the plating, the upper horizontal conductive unit 130, the first and second lower horizontal conductive units 150A and 150B may be formed with copper (Cu) or gold (Au).

The upper horizontal conductive unit 130, the first and second lower horizontal conductive units 150A and 150B are connected to the first to fourth vertical conductive units 140A to 140D to form a conductive path.

For instance, one end of the upper horizontal conductive unit 130 is connected to one end of the first lower horizontal conductive unit 150A through the first vertical conductive unit 140A. The other end of the lower horizontal conductive unit 150A is connected to the fourth vertical conductive unit 140D to form the conductive path. Also, the other end of the upper horizontal conductive unit 130 is connected to one end of the second lower horizontal conductive unit 150B through the third vertical conductive unit 140C. The other end of the second lower horizontal conductive unit 150B is connected to the second vertical conductive unit 140B to form the conductive path.

In the embodiment of the present invention, lengths of the first lower horizontal conductive unit 150A and the second lower horizontal conductive unit 150B are different from each other. This is for minimizing an area where the inductor 100 is formed on the substrate 110. That is, by positioning the second lower horizontal conductive unit 150B at an inner side of the first lower horizontal conductive unit 150A, the area where the inductor is formed may be minimized.

For instance, referring to FIG. 1, it is assumed that the first to fourth vertical conductive units 140A to 140D penetrate the body of the substrate 110 in a row. In this case, the first lower conductive unit 150A connects the first and fourth vertical conductive units 140A and 140D separated from each other to form the conductive path. Also, the second lower conductive unit 150B connects the second and third vertical conductive units 140B and 140C adjacent to each other to form the conductive path. Accordingly, the lengths of the first and second lower horizontal conductive units 150A and 150B may be different from each other.

The first to fourth vertical conductive units 140A to 140D are formed within the via hole of the substrate 110. The first vertical conductive unit 140A connects the upper horizontal conductive unit 130 and the first lower horizontal conductive unit 150A to form the conductive unit. The second vertical conductive unit 140B connects the second lower horizontal conductive unit 150B and the input electrode 120 to form the conductive path. The third vertical conductive unit 140C connects the upper horizontal conductive unit 130 and the second lower horizontal conductive unit 150B to form the conductive path. The fourth vertical conductive unit 140D connects the first lower horizontal conductive unit 150A and the output electrode 160 to form the conductive path.

The first to fourth vertical conductive units 140A to 140D may be formed in the method of plating or deposition. In the case of the method of plating, the first to fourth vertical conductive units 140A to 140D may be formed with the copper (Cu) or the gold (Au).

In the embodiment of the present invention, the first to fourth vertical conductive units 140A and 140D may be arranged in a row at regular intervals. This is for minimizing the area where the inductor 100 is formed on the substrate 110. That is, by using the first to fourth vertical conductive units 140A and 140D arranged in a row, the inductor 100 may be formed using small size of the substrate.

Meanwhile, in the embodiment of the present invention, the inductor 100 may be fabricated in various methods. For instance, the upper horizontal conductive unit 130 and the input and output electrodes 120 and 160 are formed on the upper surface of the substrate firstly. Thereafter, the plurality of via holes are formed in the body of the substrate 110. Thereafter, by filling the via holes with conductive material, the first to fourth vertical conducive units 140A to 140D are formed. After the first to fourth vertical conducive units 140A to 140D are formed, the first and second lower horizontal conductive unit 150A and 150B are formed on the lower surface of the substrate 110.

Figure 2:
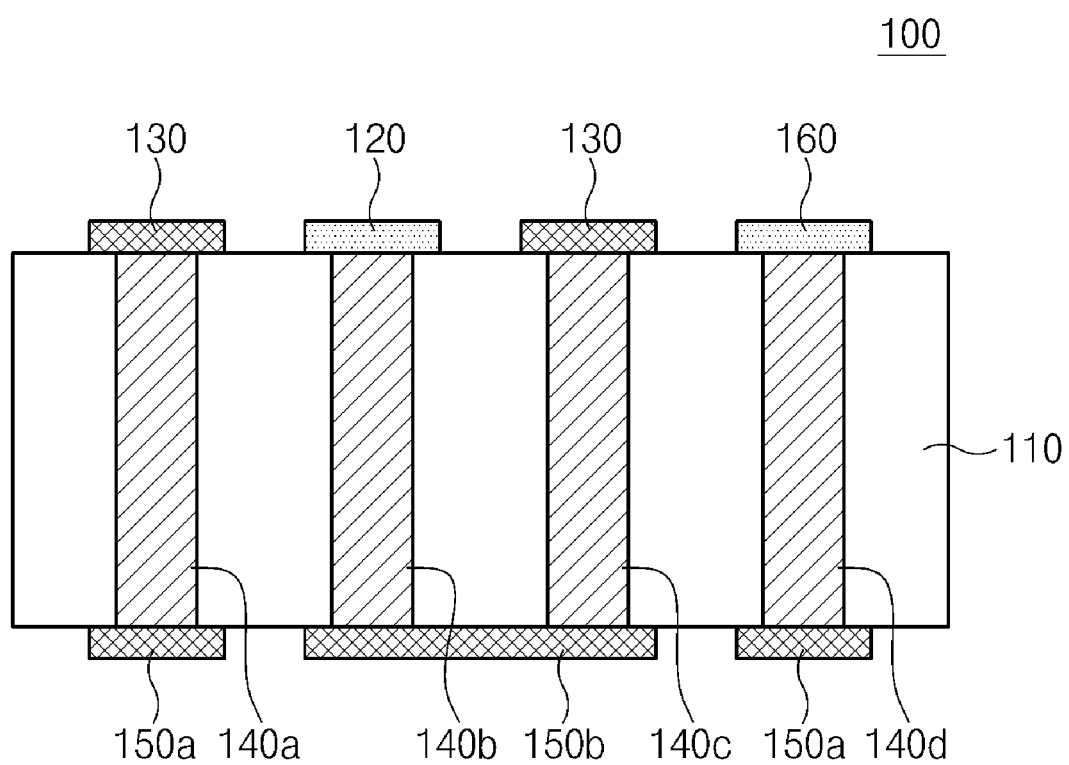
FIG. 2 is a cross-sectional view along a line of A-A' of FIG. 1.

FIG. 2 is a cross-sectional view along a line of A-A' of FIG. 1.

Referring to FIG. 2, the upper horizontal conductive unit 130 and the input and output electrodes 120 and 130 are formed at the same layer on the substrate 110. Also, the first to fourth vertical conducive units 140A to 140D are arranged in a row at regular intervals along the line of A-A'.

The first vertical conductive unit 140A penetrates the body of the substrate 110 and connects the upper horizontal conductive unit 130 and the first lower horizontal conductive unit 150A. The second vertical conductive unit 140B penetrates the body of the substrate 110 and connects the input electrode unit 120 and the second lower horizontal conductive unit 150B. The third vertical conductive unit 140C penetrates the body of the substrate 110 and connects the upper horizontal conductive unit 130 and the second lower horizontal conductive unit 150B. The fourth vertical conductive unit 140D penetrates the body of the substrate 110 and connects the output electrode 160 and the first lower horizontal conductive unit 150A.

Figure 3:
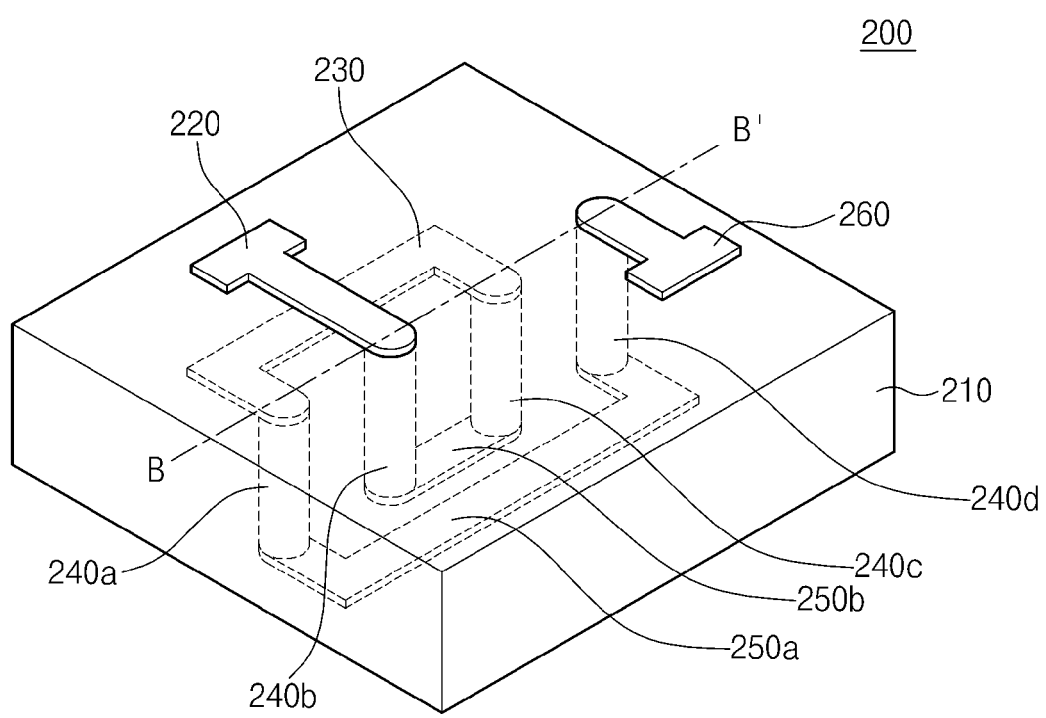
FIG. 3 is a perspective view illustrating an inductor according to another embodiment of the present invention.

FIG. 3 is a perspective view illustrating an inductor according to another embodiment of the present invention. A structure of an inductor 200 of FIG. 3 is similar to that of the inductor 100 of FIG. 1. Accordingly, differences between them will be described in detail below.

Referring to FIG. 3, the inductor 200 includes a substrate 210, an input electrode unit 220, an upper horizontal conductive unit 230, first to fourth vertical conductive units 240A to 240D, first and second lower horizontal conductive units 250A and 250B, and an output electrode unit 260. Unlike the inductor 100 of FIG. 1, the input and output electrode units 220 and 260 and the upper horizontal conductive unit 230 are positioned at different layers. This will be described more clearly referring to FIG. 4 below.

Figure 4:
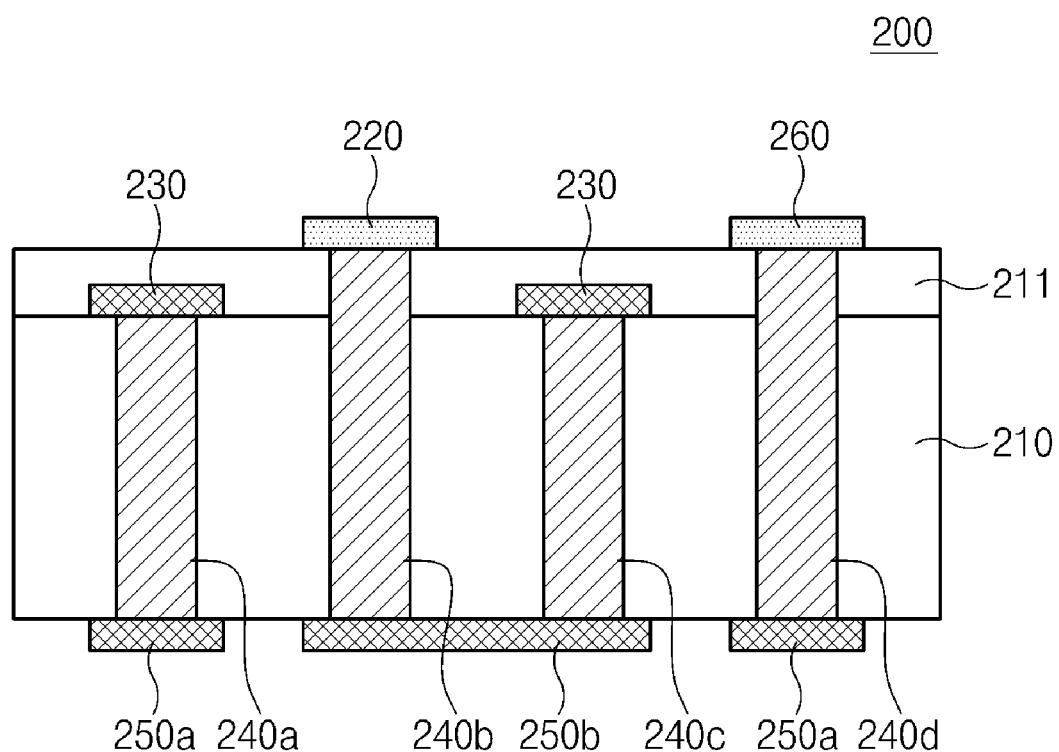
FIG. 4 is a cross-sectional view along a line of B-B' of FIG. 3.

FIG. 4 is a cross-sectional view along a line of B-B' of FIG. 3.

Referring to FIG. 4, the inductor 200 further includes an insulating layer 211 unlike the inductor 100 of FIG. 1. The upper horizontal conductive unit 230 and the input and output electrodes 220 and 260 are formed at different layers.

In detail, the insulating layer 211 is formed on the substrate 210. The upper horizontal conductive layer 230 is formed within the insulating layer 211, and the input and output electrode units 220 and 260 are formed on the insulating layer 211. Accordingly, the upper horizontal conductive unit 230 and the input and output electrode units 220 and 260 are electrically separated from each other by the insulating layer 211. Also, since the insulating layer 211 serves as a protection layer, the upper horizontal conductive layer 230 may be protected.

Meanwhile, in the other embodiment of the present invention, the insulating layer 211 includes material having insulative characteristics. For instance, the insulating layer 211 may be TEOS/BPSG. For another example, the insulating layer 211 may have a structure of $SiO_2$/SOG/$SiO_2$.

Figure 5:
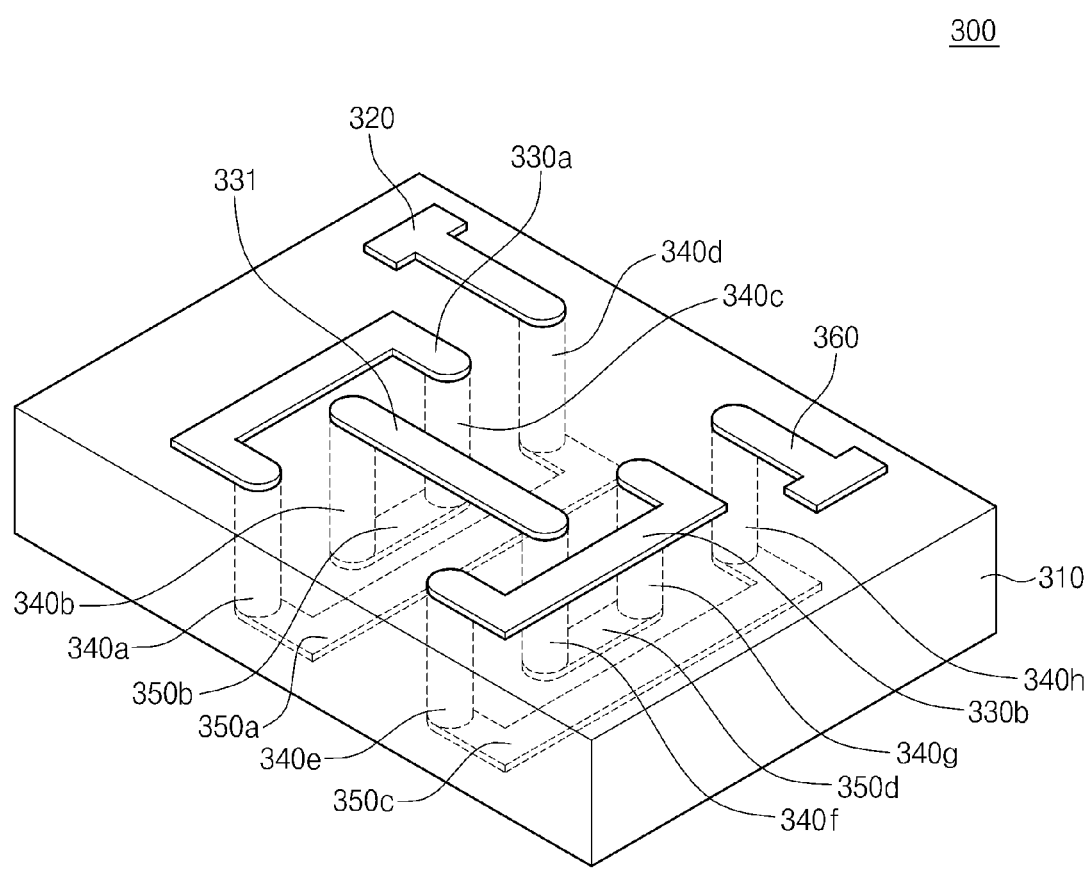
FIG. 5 is a perspective view illustrating an inductor according to another embodiment of the present invention.

FIG. 5 is a perspective view illustrating an inductor according to another embodiment of the present invention. An inductor 300 of FIG. 5 has a structure repeating the structure of the inductor 100 of FIG. 1 several times. Therefore, differences between them will be described in detail.

Referring to FIG. 5, the inductor 300 includes a substrate 310, an input electrode unit 320, first and second upper horizontal conductive units 330A and 330B, a connection conductive unit 331, first to eighth vertical conductive units 340A and 340H, first to fourth lower horizontal conductive units 350A to 350D, and an output electrode unit 360.

In detail, the first and second upper horizontal conductive units 330A and 330B and the first to fourth lower horizontal conducive units 350A to 350D are formed on an upper surface and a lower surface of the substrate 310 respectively. in this case, the structures of the first and second upper horizontal conducive units 330A and 330B and the structures of the first to fourth lower horizontal conductive units 350A to 350D are repeated structures of the upper horizontal conductive unit 130 and the first and second lower horizontal conductive units 150A and 150B respectively.

However, the inductor 300 of FIG. 5 further includes the connection conductive unit 331 for connecting the first upper horizontal conductive unit 330A and the second upper horizontal conducive unit 330B in series. The connection conductive unit 331 is formed in the same method of forming the first and second upper horizontal conductive units 330A and 330B. Also, the connection conductive unit 331 is positioned at the same layer with the first and second upper horizontal conductive units 330A and 330B.

The first to eighth vertical conductive units 340A to 340H are formed within the via hole of the substrate 310. For instance, the first to fourth vertical conductive units 340A to 340D arranged in a row and the fifth to eighth vertical conductive units 340E to 340H parallel to them are formed at the substrate 310.

The first to eighth vertical conductive units 340A to 340H connect the first and second upper horizontal conductive units 330A and 330B to the first to fourth lower horizontal conductive units 350A to 350D to form the conductive path. Also, the second and sixth vertical conductive units 340B and 340F are connected to each other by the connection conductive unit 331 to form the conductive path.

Figure 6:
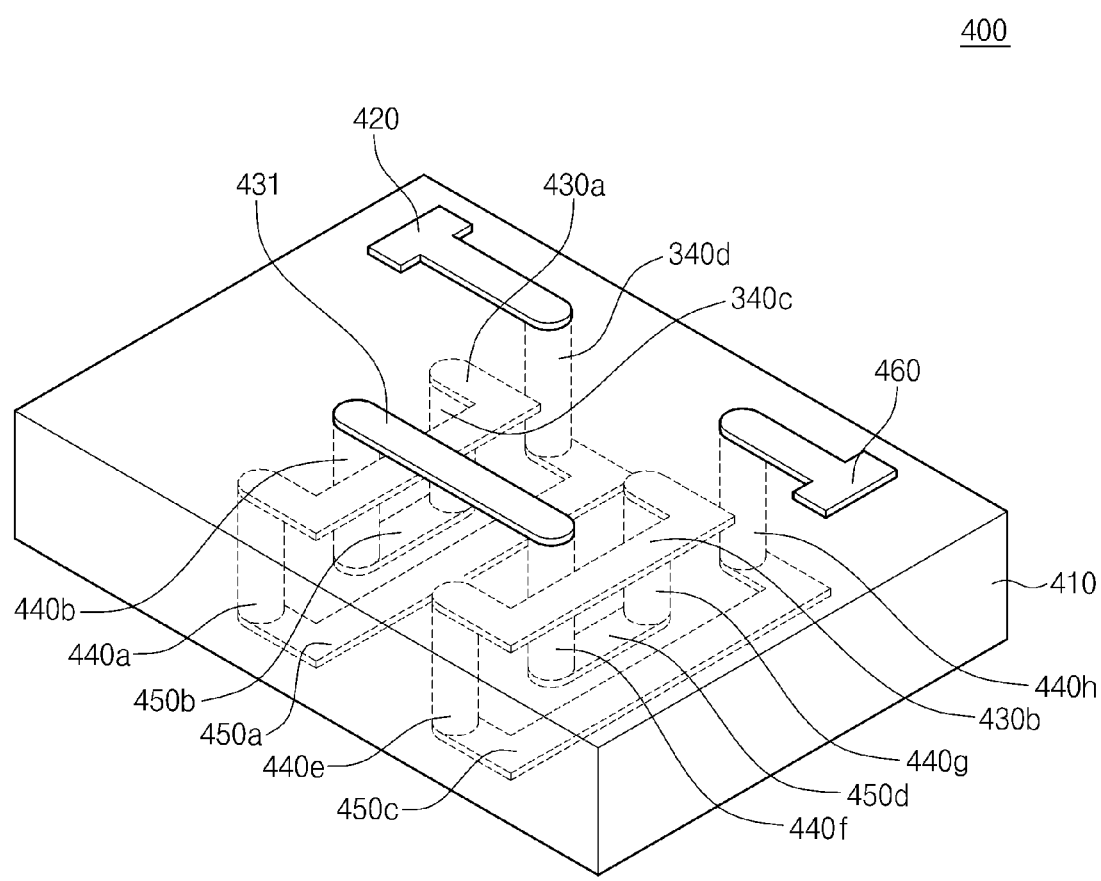
FIG. 6 is a perspective view illustrating an inductor according to another embodiment of the present invention.

FIG. 6 is a perspective view illustrating an inductor according to another embodiment of the present invention. An inductor 400 of FIG. 6 has a structure repeating the structure of the inductor 200 of FIG. 3 several times. Therefore, the structure of the inductor 400 of FIG. 6 is similar to that of the inductors 200 and 300 of FIGS. 3 and 5. Accordingly, differences between them will be described in detail below.

The inductor 400 of FIG. 6 includes a connection conductive unit 431 for connecting the upper horizontal conductive unit 230 of FIG. 3 in series like the inductor 300 of FIG. 5. However, unlike the connection conductive unit 331 of FIG. 5, the connection conductive unit 431 of FIG. 6 is positioned at a different layer from the first and second upper horizontal conductive units 430A and 430B. That is, referring to FIG. 6, the connection conductive unit 431 is positioned at the same layer with the input and output electrode units 420 and 460.

This indicates that the connection conductive unit 431 is electrically separated from the first and second upper horizontal conductive units 430A and 430B by the insulating layer. This is similar to the above-description for FIG. 3, and thus detailed explanations are omitted.

Figure 7:
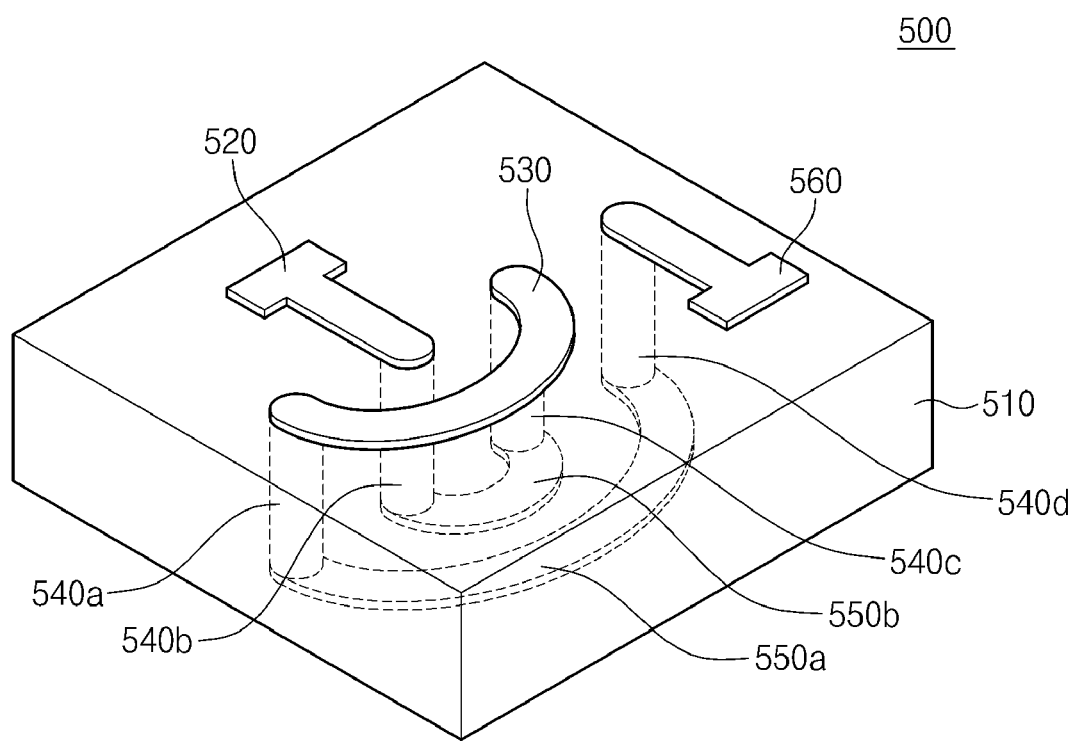
FIG. 7 is a perspective view illustrating that upper and lower horizontal conductive units of the inductor of FIG. 1 are formed as an arc shape.
Figure 8:
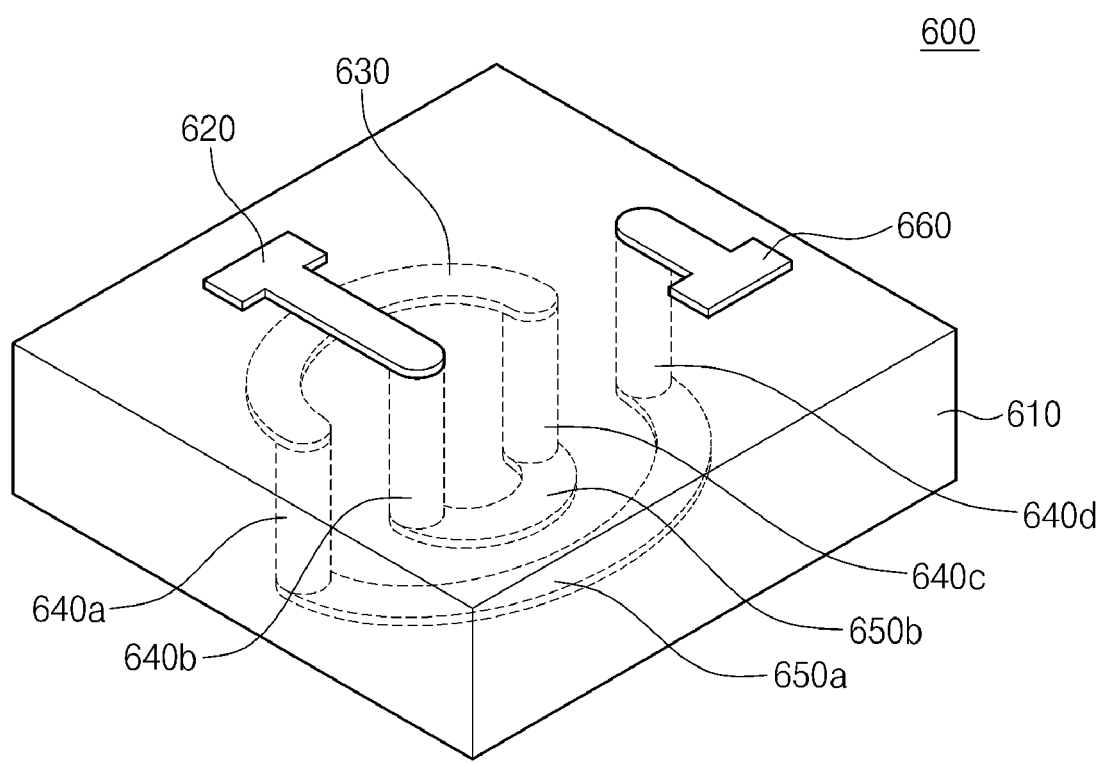
FIG. 8 is a perspective view illustrating that upper and lower horizontal conductive units of the inductor of FIG. 3 are formed as an arc shape.

Meanwhile, in another embodiment of the present invention, the upper and lower horizontal conductive units may be formed as an arc shape. For instance, FIG. 7 is a perspective view illustrating that the upper and lower horizontal conductive units of the inductor of FIG. 1 are formed as the arc shape. For another example, FIG. 8 is a perspective view illustrating that the upper and lower horizontal conductive units of the inductor of FIG. 3 are formed as the arc shape. In this case, cross-sections of the inductors of FIGS. 7 and 8 are similar to FIGS. 2 and 4.

According to the present invention, the inductor can be implemented on a small-sized semiconductor substrate. Further, the inductor has an excellent durability against an external impact.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An inductor, comprising:
   a first to a fourth conductive pillars formed in one direction within a semiconductor substrate;
   a first conductive line formed on one side of the semiconductor substrate and electrically connected to the second and third conductive pillars interiorly positioned among the first to fourth conductive pillars;
   a second conductive line formed on the one side of the semiconductor substrate and electrically connected to the first and fourth conductive pillars exteriorly positioned among the first to fourth conductive pillars; and
   a third conductive line formed on the other side of the semiconductor substrate and electrically connected to the first and third conductive pillars among the first to fourth conductive pillars.

2. The inductor of claim 1, wherein a length of the first conductive line is shorter than that of the second conductive line.

3. The inductor of claim 2, wherein each of the first conductive line and the second conductive line is implemented as a curve form.

4. The inductor of claim 1, further comprising a first and a second conductive terminals formed on the other side of the semiconductor substrate and electrically connected to the second and fourth conducive pillars respectively.

5. The inductor of claim 1, further comprising:
   an insulating layer on the other side of the semiconductor substrate; and
   a first and a second conductive layers formed on the insulating layer and electrically connected to the second and fourth conducive pillars respectively.

6. The inductor of claim 5, wherein the second and fourth conductive pillars penetrate the insulating layer.

7. The inductor of claim 1, further comprising:
   a fifth to an eighth conductive pillars in the one direction within the semiconductor substrate;
   a fourth conductive line formed on the one side of the semiconductor substrate and electrically connected to the sixth and seventh conductive pillars interiorly positioned among the fifth to eighth conductive pillars;
a fifth conductive line formed on the one side of the semiconductor substrate and electrically connected to the fifth and eighth conductive pillars exteriorly positioned among the fifth to eighth conductive pillars; and
a sixth conductive line formed on the other side of the semiconductor substrate and electrically connected to the first and third conductive pillars among the fifth to eighth conductive pillars.

8. The inductor of claim 7, further comprising a connection conductive line formed on the other side of the semiconductor substrate and electrically connected to the second and sixth conductive pillars.

9. The inductor of claim 8, further comprising an insulating layer on the other side of the semiconductor substrate, wherein the second and sixth conductive pillars penetrate the insulating layer and the connection conductive line is electrically connected to the second and sixth conductive pillars penetrating the insulating layer.

10. An inductor, comprising:
a plurality of conductive pillars penetrating a semiconductor substrate; and
a plurality of conductive lines forming a coil structure by connecting the plurality of conductive pillars,
wherein the plurality of conductive pillars comprising
a first conductive line formed on one side of the semiconductor substrate electrically connecting the second and third conductive pillars among the plurality of conductive pillars; and
a second conductive line formed on the one side of the semiconductor substrate electrically connecting the first and fourth conductive pillars among the plurality of conductive pillars,
wherein a length of the first conductive line is different from that of the second conductive line.

11. The inductor of claim 10, wherein the first to fourth conductive pillars are formed in one direction, and the second and third conductive pillars connected to the first conductive line are positioned at an inner side of the first and fourth conductive pillars connected to the second conductive line.

12. The inductor of claim 11, wherein the length of the first conductive line is shorter than that of the second conductive line.

13. The inductor of claim 12, wherein each of the first conductive line and the second conductive line is implemented as a curve form.

14. The inductor of claim 10, further comprising a third conductive line formed on the other side of the semiconductor substrate and electrically connected to one of the second and third conductive pillars connected to the first conductive line and to one of the first and fourth conductive pillars connected to the second conductive line.

15. The inductor of claim 14, further comprising:
a first conductive terminal formed on the other side of the semiconductor substrate and electrically connected to the other of the second and third conductive pillars connected to the first conductive line; and
a second conductive terminal formed on the other side of the semiconductor substrate and electrically connected to the other of the first and fourth conductive pillars connected to the second conductive line.

16. The inductor of claim 10, wherein the plurality of conductive lines further comprises:
a third conductive line formed on the one side of the semiconductor substrate electrically connecting the sixth and seven conductive pillars among the plurality of conducive pillars; and
a fourth conductive line formed on the one side of the semiconductor substrate electrically connecting the fifth and eighth conductive pillars among the plurality of conducive pillars.

17. The inductor of claim 16, wherein the fifth to eighth conducive pillars are formed in one direction, and the sixth and seven conductive pillars connected to the third conductive line are positioned at an inner side of the fifth and eighth conductive pillars connected to the fourth conductive line.

18. The inductor of claim 17, wherein the fifth to eighth conductive pillars are parallel to the first to fourth conductive pillars.

19. The inductor of claim 16, further comprising a connection conductive line formed on the other side of the semiconductor substrate electrically connecting one of the first to fourth conductive pillars to one of the fifth to eighth conductive pillars.

20. The inductor of claim 19, further comprising an insulating layer on the other side of the semiconductor substrate, wherein the one of the first to fourth conductive pillars and the one of the fifth to eighth conductive pillars penetrate the insulating layer.

* * * * *